US011041809B2

(12) United States Patent
Shao et al.

(10) Patent No.: US 11,041,809 B2
(45) Date of Patent: Jun. 22, 2021

(54) ULTRAHIGH RESOLUTION DYNAMIC IC CHIP ACTIVITY DETECTION FOR HARDWARE SECURITY

(71) Applicant: President and Fellows of Harvard College, Cambridge, MA (US)

(72) Inventors: Linbo Shao, Allston, MA (US); Marko Loncar, Cambridge, MA (US)

(73) Assignee: PRESIDENT AND FELLOWS OF HARVARD COLLEGE, Cambridge, MA (US)

( * ) Notice: Subject to any disclaimer, the term of this patent is extended or adjusted under 35 U.S.C. 154(b) by 0 days.

(21) Appl. No.: 15/766,845

(22) PCT Filed: Oct. 7, 2016

(86) PCT No.: PCT/US2016/055937
§ 371 (c)(1),
(2) Date: Apr. 9, 2018

(87) PCT Pub. No.: WO2017/062735
PCT Pub. Date: Apr. 13, 2017

(65) Prior Publication Data
US 2018/0284026 A1 Oct. 4, 2018

Related U.S. Application Data

(60) Provisional application No. 62/239,045, filed on Oct. 8, 2015.

(51) Int. Cl.
*G01N 21/64* (2006.01)
*G01R 31/308* (2006.01)
*G01R 1/06* (2006.01)
*G01R 31/302* (2006.01)
(Continued)

(52) U.S. Cl.
CPC ........... *G01N 21/6489* (2013.01); *G01R 1/06* (2013.01); *G01R 23/17* (2013.01);
(Continued)

(58) Field of Classification Search
CPC ............... G01N 21/64; G01N 21/6402; G01N 21/6404; G01N 21/6408; G01N 21/6428;
(Continued)

(56) References Cited

U.S. PATENT DOCUMENTS 6,122,042 A    9/2000  Wunderman et al.
9,201,403 B2 * 12/2015  Gan .......................... G04F 5/145
(Continued)

OTHER PUBLICATIONS

Nowodzinski et al. "Nitrogen-Vacancy centers in diamond for current imaging at the redistributive layer level of Integrated Circuits" Elsevier Ltd. Jul. 7, 2015, p. 1549-1553 (Year: 2015).*
(Continued)

*Primary Examiner* — David P Porta
*Assistant Examiner* — Mamadou Faye
(74) *Attorney, Agent, or Firm* — Foley Hoag LLP; Alexander Akhiezer; Erik A. Huestis

(57) ABSTRACT

A system and method for detecting dynamic electromagnetic emission of an integrated circuit (IC) chip is provided. One embodiment of the method, includes exciting nitro vacancy (NV) centers of a diamond slide located in close proximity to the IC chip via use of light, resulting in an NV fluorescence; providing an optical readout of the NV fluorescence, wherein the optical readout provides quantum states of the NV centers, thereby providing a spectra of electromagnetic fields of the IC chip. A determination is then made of at least one of the group comprising clock frequencies of the IC chip, referred to herein as determined clock frequencies, and data bandwidth of the IC chip, referred to herein as determined data bandwidth of the IC chip, from the spectra of electromagnetic fields of the IC chip. A comparison is then performed, comparing at least one of the group comprising determined clock frequencies and determined data bandwidth, to at least one of the group comprising expected clock frequencies of the IC chip and expected data bandwidth of (Continued)

the IC chip, thereby determining if a foreign device or software is located on the IC chip.

7 Claims, 6 Drawing Sheets

(51) Int. Cl.
  *G01R 23/17* (2006.01)
  *G01R 31/28* (2006.01)
  *G01R 31/44* (2020.01)
(52) U.S. Cl.
  CPC ....... *G01R 31/2884* (2013.01); *G01R 31/302* (2013.01); *G01R 31/308* (2013.01); *G01R 31/44* (2013.01); *G01N 2201/06113* (2013.01)
(58) Field of Classification Search
  CPC ........... G01N 21/6445; G01N 21/6447; G01N 21/645; G01N 21/6454; G01N 21/6456
  See application file for complete search history.

(56) References Cited

U.S. PATENT DOCUMENTS

| 2003/0038877 | A1 | 2/2003 | Pfefferseder et al. |
| 2003/0014676 | A1 | 8/2003 | Pakdaman et al. |
| 2008/0038877 | A1* | 2/2008 | Wang ................... G06F 12/1416 438/125 |
| 2013/0044003 | A1* | 2/2013 | Eguro ................... G06F 21/554 340/653 |
| 2013/0204553 | A1* | 8/2013 | Kung ................. G01R 31/2601 702/58 |
| 2014/0291867 | A1* | 10/2014 | Bintang .................. H01L 22/14 257/777 |
| 2015/0137793 | A1* | 5/2015 | Englund ................ G01K 11/00 324/96 |
| 2016/0041226 | A1* | 2/2016 | Walter ............. G01R 31/31719 326/8 |
| 2016/0077167 | A1* | 3/2016 | Heidmann ............. G01N 24/10 324/304 |

OTHER PUBLICATIONS

Huang et al. "The detection of counterfeit integrated circuit by the use of electromagnetic fingerprint." In: EMC Europe 2014. Sep. 25, 2014 (Sep. 25, 2014).

International Search Report and Written Opinion for PCT/US2016/055937 dated Dec. 15, 2016.

* cited by examiner

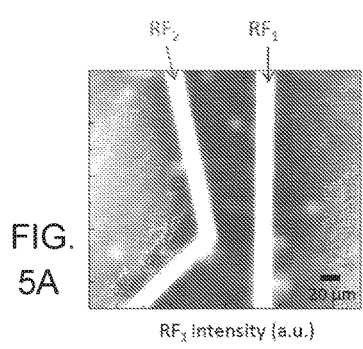
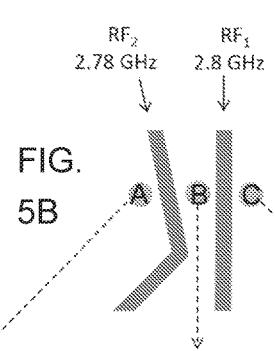
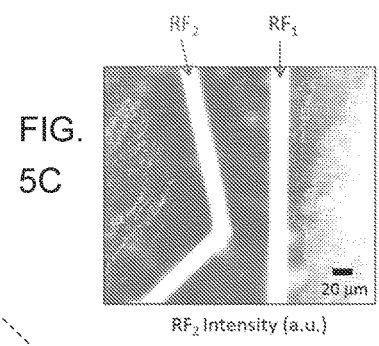
FIG. 5A
FIG. 5B
FIG. 5C
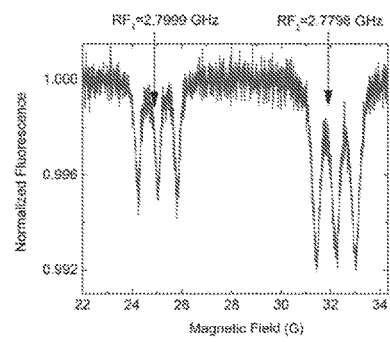
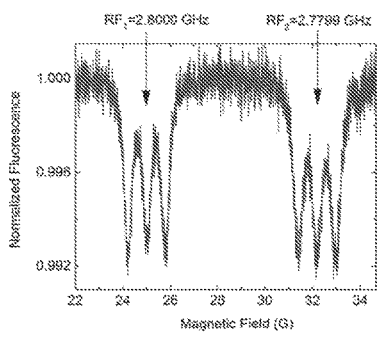
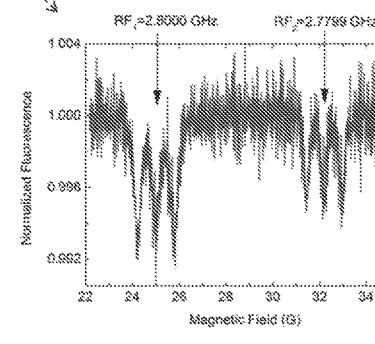
FIG. 5D
FIG. 5E
FIG. 5F

ULTRAHIGH RESOLUTION DYNAMIC IC CHIP ACTIVITY DETECTION FOR HARDWARE SECURITY

CROSS-REFERENCE TO RELATED APPLICATION

This application claims priority to U.S. Provisional application entitled, "ULTRAHIGH RESOLUTION DYNAMIC IC CHIP ACTIVITY DETECTION FOR HARDWARE SECURITY," having Ser. No. 62/239,045, filed Oct. 8, 2015, which is entirely incorporated herein by reference.

FIELD OF THE INVENTION

The present invention is generally related to hardware security of integrated circuits, and more particularly is related to providing dynamic analysis of an integrated circuit to determine whether unpermitted actions are being taken.

BACKGROUND

Ubiquitous issues with software malware as well as lack of deep insight into the inner workings of the processor chip as it is executing individual instructions requires a new approach for securing mission-critical software. Today, advanced malware can hide inside the operating system or hypervisor (i.e., rootkits) making it difficult to rely on anti-virus or on other software defenses to correctly report state of the system—external methods are needed to observe operation of the software and the processor. Meanwhile, existing methods based on use of electromagnetic (EM) emanations analysis require discrete antennas and have low spatial resolution with respect to the size of the processor chip. Only bulk signature of software operation is observable and software's use of individual functional units is not observable. Thermal imaging can give more insights into which parts of the chip are active, but has large time-scales as repeated operations are needed to heat up certain parts of the chip for them to be observable. Moreover, heat spreading through the package blurs out the image. These are real-time, non-invasive techniques but are severely limited in spatial and temporal resolutions.

In addition to software issues, the ubiquitous presence of integrated circuit (IC) chips and globalization of microelectronics design and manufacturing provide ample opportunity for concealment of hardware Trojans in ICs or other modifications to the hardware. Presently, real-time non-invasive analysis of the dynamic activities in processors is not available. Yet, there are constant fears about hidden hardware Trojans potentially inserted into commodity hardware. Malicious components can leak information and bypass operating system (OS) and hypervisor-based protection mechanisms. Even if the hardware is correct, kernel and hypervisor rootkits can manipulate (e.g. disable) certain hardware features without outright side-effects.

In recent years, hardware security has been a serious concern in military, financial and government computing infrastructures, and household appliances and customer privacy. The ubiquitous presence of integrated circuits (IC) and globalization of microelectronics design and manufacturing increase the potential of technical vulnerabilities. On the one hand, an adversary can implement hardware Trojans that may disable and/or destroy a system at future time, or leak confidential information and secret keys covertly. These hardware Trojans are extremely hard to detect because the scale of alterations is tiny compared with the entire chip design, the nanoscale feature sizes of advanced IC fabrication are challenging to monitor, and conditions that trigger a Trojan circuit are unknown. On the other hand, side channel cryptanalysis has successfully attacked many cryptographic implementations. Side channel attacks bypass the theoretical strength of cryptographic algorithms by exploiting weaknesses in the hardware implementation including power consumption, electromagnetic radiation, light, timing, and sound. Nearly all types of IC chips, including application-specific integrated circuits (ASICs), field programmable gate arrays (FPGA), digital signal processors (DSP), microprocessors, microcontrollers, and analog and digital sensors can be susceptible to both hardware Trojans and side channel attacks. In particular, the chips from untrusted sources or defective designs can significantly increase vulnerability and compromise hardware security. For example, companies like Microsoft rely on genuine and secure hardware for operation of their data and cloud computing offerings, yet they have little to no insights into what is going on in the hardware of the processors powering their servers, especially during runtime.

Several efforts, including analyzing hardware description language codes for hidden functionality, split-manufacturing for preventing insertion of hidden Trojans, and destructive teardowns of hardware, have been made to address the concerns about hardware integrity. While side channel attacks have demonstrated by, for example, measuring the runtime power consumption, capturing temperature imaging (i.e. infrared light radiation), electromagnetic emission, those techniques are far below in ability to detection of hardware Trojans. Detecting electromagnetic emission is very promising, since many elements of an IC chip, including clock networks, signal lines, and transistors, radiate electromagnetic waves during operation. Both amplitude modulation and frequency modulation during runtime have been observed from electromagnetic emission. Since most information contained in electromagnetic emission is stored within the distance less than one wavelength (i.e. near field) from the emission sources (e.g. transistors), near-field sensing of the electromagnetic field is more desirable than far-field (more than two wavelength in distance). However, the near-field sensing of electromagnetic field is challenging especially for high frequency signals, owing to the short wavelength (about 3 cm for 10 GHz signal) and low intensity (electromagnetic emissions depends on the electrical currents).

Thus, a heretofore unaddressed need exists in the industry to address the aforementioned deficiencies and inadequacies.

SUMMARY OF THE INVENTION

Embodiments of the present invention provide a system and method for detecting dynamic electromagnetic emission of an integrated circuit (IC) chip. Briefly described, in architecture, one embodiment of the system, among others, can be implemented as follows. The system contains an IC chip being tested; a diamond slide having nitro vacancy (NV) centers located on the IC chip being tested, where the diamond slide is placed in close proximity to the IC chip, either outside a package of the IC chip or inside the package of the IC chip; a light source for exciting the NV centers resulting in an NV fluorescence; an imager for providing an optical readout of the NV fluorescence, wherein the optical readout provides quantum states of the NV centers, thereby providing a spectra of electromagnetic fields of the IC chip; and a computer in communication with the imager for determining at least one of the group comprising clock frequencies of the IC chip, referred to herein as determined clock frequencies, and data bandwidth of the IC chip, referred to as determined data bandwidth of the IC chip, from the spectra of electromagnetic fields of the IC chip.

The present invention can also be viewed as providing methods for detecting dynamic electromagnetic emission of an integrated circuit (IC) chip. In this regard, one embodiment of such a method, among others, can be broadly summarized by the following steps: exciting nitro vacancy (NV) centers of a diamond slide located in close proximity to the IC chip via use of light, resulting in an NV fluorescence; providing an optical readout of the NV fluorescence, wherein the optical readout provides quantum states of the NV centers, thereby providing a spectra of electromagnetic fields of the IC chip; determining at least one of the group comprising clock frequencies of the IC chip, referred to herein as determined clock frequencies, and data bandwidth of the IC chip, referred to herein as determined data bandwidth of the IC chip, from the spectra of electromagnetic fields of the IC chip; and comparing at least one of the group comprising determined clock frequencies and determined data bandwidth, to at least one of the group comprising expected clock frequencies of the IC chip and expected data bandwidth of the IC chip.

The present invention can further be viewed as a method for detecting dynamic electromagnetic emission of an integrated circuit (IC) chip, which comprises the steps of: exciting nitro vacancy (NV) centers of a diamond slide located in close proximity to the IC chip via use of light, resulting in an NV fluorescence; providing an optical readout of the NV fluorescence, wherein the optical readout provides quantum states of the NV centers, thereby providing a spectra of electromagnetic fields of the IC chip; determining data characteristics of the IC chip from the spectra of electromagnetic fields of the IC chip when the IC chip transmits data; and comparing the determined data characteristics to expected data characteristics of the IC chip to determine if a foreign device or software is affecting the tested IC chip.

Other systems, methods, features, and advantages of the present invention will be or become apparent to one with skill in the art upon examination of the following drawings and detailed description. It is intended that all such additional systems, methods, features, and advantages be included within this description, be within the scope of the present invention, and be protected by the accompanying claims.

BRIEF DESCRIPTION OF THE DRAWINGS

Many aspects of the invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

FIG. 5A illustrates RF1 intensity.

FIG. 5B is a schematic diagram illustrating a micro radio-frequency coupler used to demonstrate the ability of the present invention and associated method.

FIG. 5C illustrates RF2 intensity.

FIGS. 5D-F illustrate the resulting spectra at three typical positions that result from the bias magnetic field B0 being scanned from 22 Gauss to 35 Gauss by an electromagnet.

DETAILED DESCRIPTION OF THE INVENTION

Figure 1A:
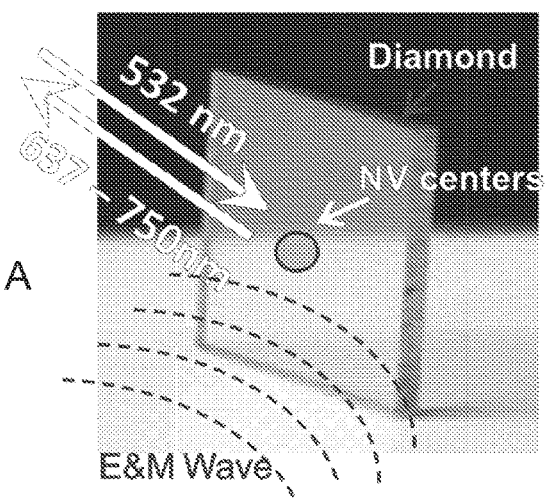
FIG. 1A is a schematic diagram illustrating the detecting of electromagnetic waves using NV centers.

The present system and method provides techniques, devices, and systems for ultrahigh spatial resolution detection of near-field electromagnetic emission. In particular, the present invention provides a technique that uses negatively charged nitrogen-vacancy (NV—) color centers in diamond. This technique for dynamic chip activity analysis can analyze electromagnetic emission with spatial resolution down to a single transistor or logic gate level. Furthermore, the present system and method can distinguish the frequencies of electromagnetic emission over a wide band, meaning that it can show the frequency spectra of electromagnetic fields. Importantly, the present method is non-destructive and will not perturb the functionality of IC chips. The present system and method can also be performed at runtime. The present system and method can obtain fine information of dynamic IC chip behaviors, and provides new ways in chip verification, chip identification, hardware Trojan detection, and side-channel information leak detection.

Aspects of the present system and method provide a new non-invasive technique for detecting the dynamic electromagnetic emission of IC chips using NV centers in diamond. By using an optical readout of the quantum states of NV centers, an IC chip can be imaged by radio-frequency spectrometry at runtime, which leads to several advantages over the prior work in hardware Trojan detections and side channel attacks. Several highlighted features of the present invention are described hereinafter.

1) Megapixel Imaging Resolution

In accordance with the present system and method, NV centers in diamonds are utilized as sensors, which convert the IC chip local electromagnetic fields to optical readout signals, which are signal lights generated by the NV, that are sent to a Charge-Coupled Device (CCD) array. While diamond slides can easily be placed on the top or bottom of an IC chip, the optical readout process can alternatively be performed at a distance as long as an optical path from the NV centers to the CCD array, or other detector, is secured. A detecting light and signal light are in the wavelengths of the visible light band, and thus the optical readout, which consists of the signal light, enjoys less noise compared to radio-frequency signals. Further, optical readouts of multiple NV centers can be determined simultaneously by using an Electron Multiplying Charge-Coupled Device (EM-CCD), which means NV centers at megapixels can be readout by a single shot image. As such, the present technique provides a wide-field ability for detecting over the region of an entire IC chip without requiring position scanning techniques.

2) Ultrahigh Spatial Resolution

As is described in detail herein, since NV centers convert information in electromagnetic fields to optical readout signals at the position very close to (i.e. near field) the sources of electromagnetic field, (i.e. elements on IC chips), the electromagnetic field generated by single elements has not been blurred out at the position of NV centers. This is crucial in detecting high frequency signals, since the high frequency electromagnetic wave by different elements will blur out much faster due to diffraction when propagating in space.

Further, the NV centers in diamonds are capable of detecting an electromagnetic field with atomic (sub-nanoscale) spatial resolution. NV centers are atomic defects in the crystal of a diamond created by a nitrogen atom with a vacancy nearby, and it only interacts with local electrical and magnetic fields. In the other word, NV centers detect the electromagnetic field at the same position. The abovementioned two reasons make the present system and method beneficial for an ultrahigh spatial resolution.

3) Sub-Megahertz Electromagnetic Frequency Spectrometry

The optical readout signal of NV centers depends not only on the intensity of electromagnetic field, but also on the frequency of the electromagnetic field. Basically, only the electromagnetic field at the resonant frequency of electrons associated with NV centers will generate an optical readout signal in accordance with the present invention. Further, the resonant frequency can be tuned by applying an external DC magnetic field. In accordance with one exemplary embodiment, for illustration purposes, the dynamic range of resonant frequency is from about 500 MHz and up to more than 10 GHz, where 2.87 GHz is the resonant frequency without an external magnetic field. Physically, this range is determined by how large the DC magnetic field is. It is noted that by using a super strong magnet, the range of the example, can be exceeded. This tuning can be achieved, for example, by tuning the current of an electromagnet with accuracy better than 100 kHz by a low-cost commercially available electromagnet.

Thus, by scanning the resonant frequency of NV centers, the spectra of the electromagnetic fields can be obtained at every position where an NV center is located. The resolution in frequency is limited by quantum coherence time of NV centers, which leads to less than 500 kHz for commercially available diamond samples (e.g. from Element Six Inc). The spectrum of the electromagnetic field provides information about the clock frequencies of IC chips and data bandwidth of IC chips. Specifically, the location of the peak in an electromagnetic frequency spectrum infers the clock frequency of the IC chip, while the width of the peak in the spectrum infers the bandwidth of the IC chip. In addition to the abovementioned, a spectrum of electromagnetic fields associated with data transmitted by the IC chip may be used, as opposed to, or in addition to, the clock frequencies and data bandwidth of IC chips. As is described in detail below, the determined clock frequency and bandwidth of the IC chip can be compared to an expected value or range for the IC chip, and/or the data characteristics of the IC chip as displayed by the electromagnetic frequency spectrum associated with the IC chip during transmission of data can be compared to expected data characteristics of the IC chip. If there is no match, it is known that a foreign element is located or affecting the IC chip.

4) Real-Time Non-Invasive Measurement and Detection

In accordance with the present system and method, and as is explained in greater detail herein, although continuous capturing is not required, the optical signal of NV centers can be captured continuously, thus allowing for real-time detection. For example, by using an EM-CCD, an image of optical signals (i.e. intensities of NV centers fluorescence) can be captured every 35 milliseconds, or at a different interval. This can be further improved by using a high-speed CCD.

Further, as is described in detail hereinbelow, the present system and method uses a probing light for exciting an electron associated with the negatively charged NV center from its ground state to an excited state. As long as any probing light that is used is isolated from the elements in an IC chip, the present system and method for detection will not have any side effects on the functionality of the IC chip, even if the IC chip is light sensitive. Such isolation can be easily achieved, for example, by depositing a thin layer of any visibly opaque but radio frequency transparent material (e.g. Silicon) on the chip or diamond, so as to block any probing light from elements of the IC chip. Therefore, the present technique is promising for runtime detection of IC chips.

As described in detail below, the present system and method provides a significant impact on hardware and software security. A non-invasive real-time analysis technique, device and system is provided that will provide consumers of hardware products (e.g., companies like Microsoft) with the ability to non-destructively analyze the hardware they have purchased and the operation of the nanometer transistors within to ensure hardware (and software) security.

The physical principle of the present detection technique using NV centers involves the quantum states of an atomic defect (i.e. NV centers) in a solid state material (i.e. diamond), and optical readout of the populations in quantum states. It should be noted that the term "populations" means the probabilities of an NV in different quantum states. For example, one quantum state may have 60% in spin-0 state, and another quantum state may have 40% in spin-1 state. According the nomenclature in the industry, we say that the population of spin-0 state is 0.6

Figure 1B:
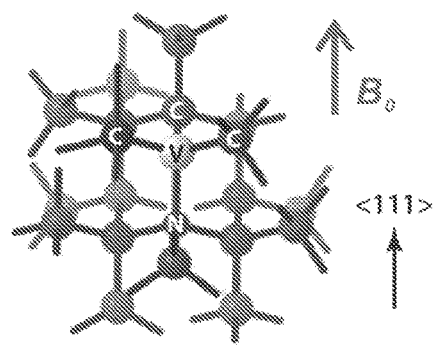
FIG. 1B is a schematic diagram illustrating an NV center, which consists of two lattice defects in an otherwise perfect diamond lattice

An NV center is an atomic-like system in the solid state, which, as illustrated by the schematic diagram of FIG. 1B, consists of two lattice defects in an otherwise perfect diamond lattice: two proximal carbon atoms are knocked out, and one of them is replaced by nitrogen (N) and the other site remains vacant (V). For FIG. 1B the lattice structure of NV centers in diamond, C for Carbon atoms, the NV center is aligned with the <111> crystal direction, and B0 is the direction of bias DC magnetic field for resonant frequency tuning.

FIG. 1A is a schematic diagram illustrating the detecting of electromagnetic (E&M) waves using NV centers. As shown in FIG. 1A, when illuminated by green light (illustrated by the arrow pointing toward the NV centers labelled 532 nm), an electron associated with the negatively charged NV center (the electron comes from nearby donors or defects) can be excited from its ground state to the excited state, after which it emits red photons (illustrated by the arrow point away from the NC centers labelled 637-750 nm) and it returns to the ground state.

Figure 1C:
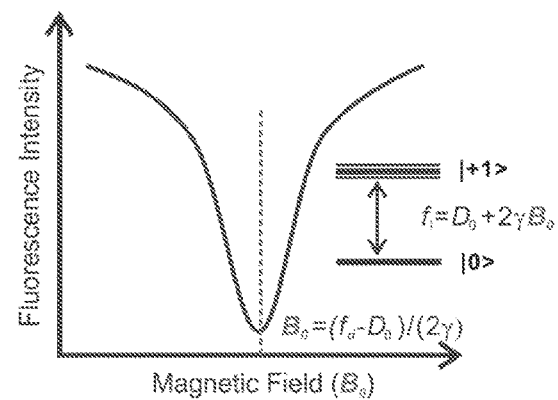
FIG. 1C is a graph illustrating a simplified level scheme in the ground state of the NV plotted.

The simplified level scheme in the ground state of the NV (excited states are not shown) is plotted in inset of the graph of FIG. 1C. There are two quantum states labeled with |0> and |+1>, where 0 and +1 indicate their spin quantum number of the electron. The energy difference $f_t$ (i.e. the resonant frequency for electromagnetic field) between the two states is given by equation 1, $$f_i = D_0 + 2\gamma B_0 \qquad \text{Eq. 1}$$

where $D_0=2.87$ GHz is the zero-field splitting, $\gamma=28$ GHz/T is the electron gyromagnetic ratio, and $B_0$ is the bias DC magnetic field as applied by an electromagnet. In the measured spectrum of FIG. 1C, the dip indicates the frequency $f_d$ of the electromagnetic field. The inset illustrates the simplified energy diagram of NV quantum states, the energy separated by $f_i$, which is determined by a zero-field splitting $D_0$ and bias magnetic field $B_0$.

Importantly, the probability of photon emission after green illumination is dependent on the spin state of the electron: in spin state |0> the NV is more likely to emit a photon than when it is in its spin state |1>. This feature has been used to do very sensitive magnetic field measurements by applying a combination of green laser pulses and microwave fields at 2.87 GHz. Since the size of the NV centers is basically the size of two atoms, spatial resolution enabled by this system is very large, and is typically limited by the ability of the optical component (e.g. microscopy objective, CCD) used to image the emitted red photons, as described below.

The present technique for the detection of electromagnetic fields using NV centers may be described as follows. The spin of an NV electron is first prepared in the |0> state optically, and exposed to electromagnetic waves originating from the IC chip. By applying the green laser/light to the NVs, the NVs will be then be |0> state in majority. This is due to the electron energy structure of the NV centers, when the NV cycles between excited states and ground states, it will more probably go to |0> than |1> spin state. By this way, we can prepare the NV in |0> state. This procedure is well known to the field, and is the nature of the NV center.

When the frequency of these electromagnetic waves is resonant with a frequency of interest, $f_i$, corresponding to the energy separation between |0> and |1> state, the spin state will be changed to |+1> (or some superposition of |0> and |+1>). Since the |+1> state fluoresces less than the |0> state, as described above, the population of each spin state can be monitored simply by detecting light emitted from the NVs. In order to tune the NV into different microwave frequencies present in the electromagnetic signal of interest—$f_i$—the strength of bias DC magnetic field is simply changed. It is noted that the electromagnetic signal of interest could be the signal from the normal/designed circuit functionality (to verify the design) or due to the Trojan. When the frequency of object electromagnetic field $f_d$ is the same as the resonant frequency of interest $f_i$, (i.e. $f_i = f_d$) the fluorescence intensity of NV centers will be lowered. Therefore, by sweeping the intensity of the external magnetic field (e.g., using an electromagnet, as described below) a wide range of radio-frequency and microwave frequencies can be probed, and spectral analysis of electromagnetic signals originating from an IC of interest can be performed. The spectral analysis may entail, as a non-limiting example, finding peaks in the spectrum, measuring width of each peak, determining relationships between peaks, or other methods of performing such spectral analysis. Importantly, by using more than $10^{12}$ of NV centers per centimeter squared distributed all over the diamond surface simultaneously, it is possible to image the distribution of RF and microwave fields over a wide area (megapixel resolution).

Figure 2:
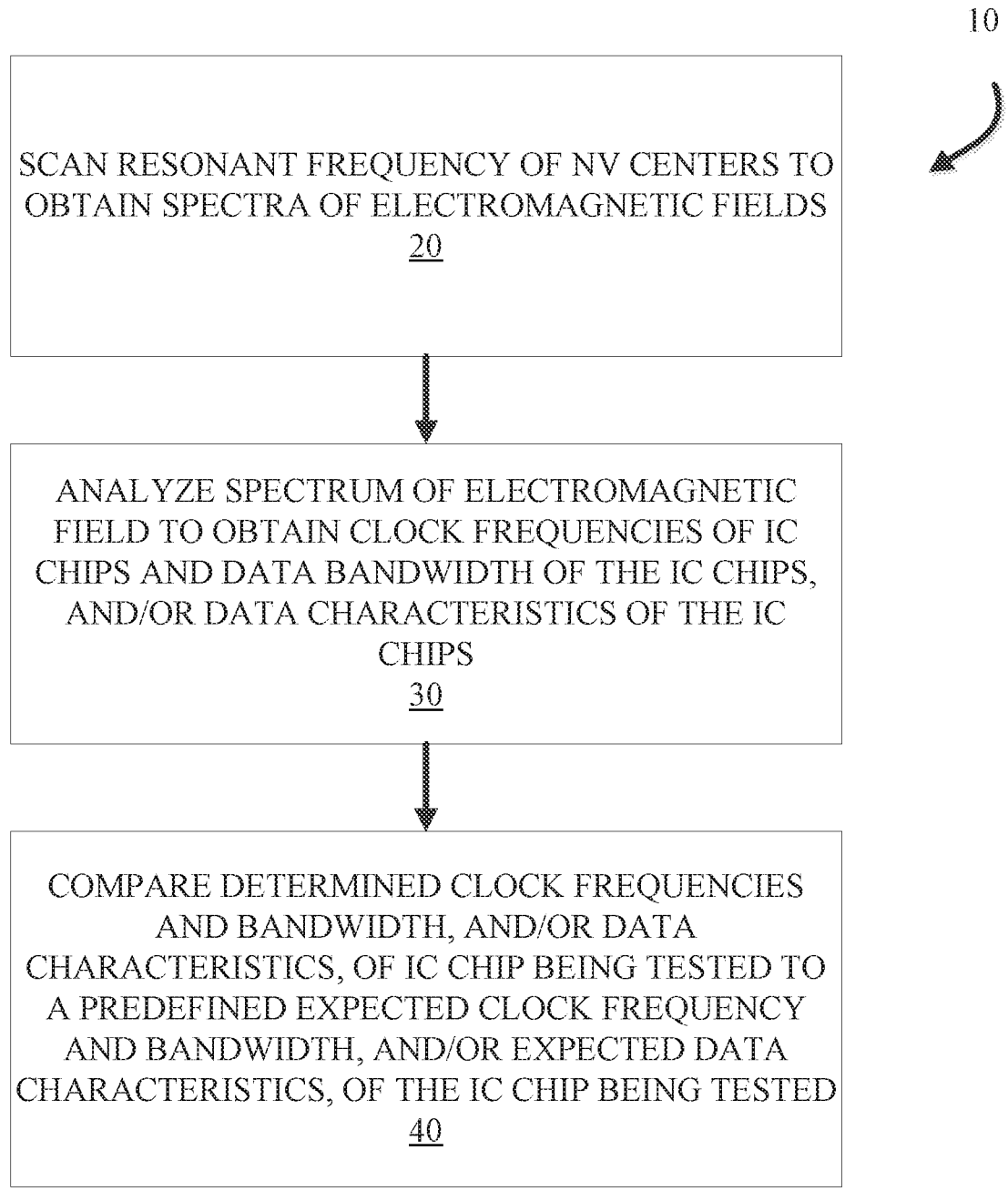
FIG. 2 is a flowchart summarizing steps performed by the present system and method in the process of detecting a hardware security risk for a tested IC chip.

FIG. 2 is a flowchart 10 summarizing steps performed by the present system and method in the process of detecting a hardware security risk for a tested IC chip. These steps are described in further detail within the present detailed description. It should be noted that any process descriptions or blocks in flowcharts should be understood as representing modules, segments, portions of code, or steps that include one or more instructions for implementing specific logical functions in the process, and alternate implementations are included within the scope of the present invention in which functions may be executed out of order from that shown or discussed, including substantially concurrently or in reverse order, depending on the functionality involved, as would be understood by those reasonably skilled in the art of the present invention.

As is shown by block 20, the present system scans resonant frequency of NV centers to obtain spectra of electromagnetic fields associated with an IC chip being tested. The spectrum of electromagnetic field is then analyzed to provide information about the clock frequencies of the IC chip and data bandwidth of the IC chip (block 30). Alternatively, or in addition, a spectrum of electromagnetic fields associated with data transmitted by the IC chip may be analyzed for the IC chips.

As shown by block 40, a comparison is then performed between the determined clock frequencies and bandwidth of the IC chip being tested to expected predefined clock frequencies and bandwidth of the IC chip being tested to determine if a foreign device or software is affecting the tested IC chip. In addition, or in the alternative, data characteristics of the IC chip as displayed by the electromagnetic frequency spectrum associated with the IC chip during transmission of data can be compared to expected data characteristics of the IC chip to determine if a foreign device or software is affecting the tested IC chip.

Figure 3:
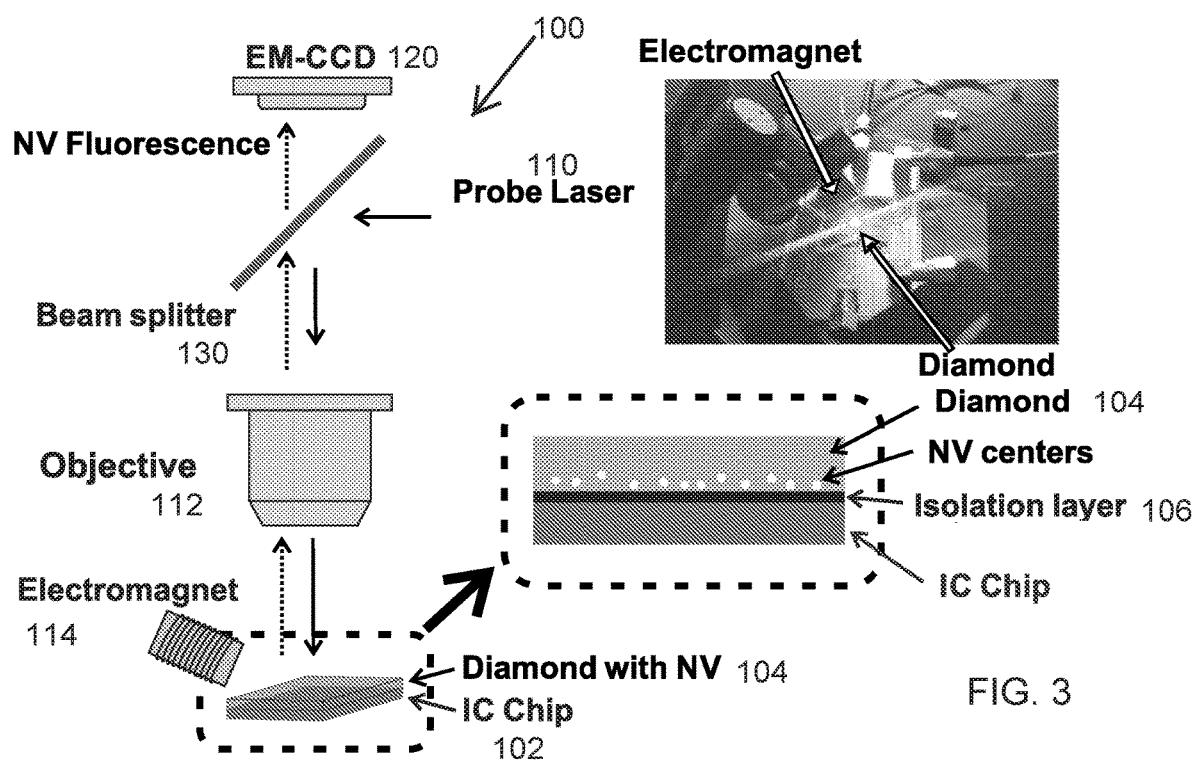
FIG. 3 is a schematic diagram of a chip activity imager, in accordance with the present invention.

FIG. 3 is a schematic diagram of a chip activity imager 100, in accordance with the present invention. It should be noted that FIG. 3 is provided for exemplary purposes only, and is not intended to limit the present system and method to merely using the components illustrated. The chip activity imager 100 provides detection techniques as described in accordance with the present system and method.

An IC chip, which is to be tested, is referred to herein as a target IC chip. The target IC chip 102 is placed under a diamond slide 104 with NV centers. If the IC chip 102 is sensitive to visible light, an isolation layer 106 can be located on the IC chip 102, which blocks both probe light, as described below, and NV fluorescence (i.e., the optical readout signal) from the IC chip 102.

It should be noted that the diamond slide 104, or diamond chip, in accordance with the present invention, merely needs to be placed in close proximity to the target IC chip 102, either outside the IC package, as illustrated by FIG. 3, or inside the package. In accordance with the present exemplary embodiment, diamond is embedded with a sheet of NV$^-$ centers below the surface of the diamond (for instance, but not limited to, ~10 nm below the surface), either during diamond growth or via ion implantation of nitrogen into ultrapure synthetic diamond substrates.

A probe laser 110, or other source of light, is used to excite the NV centers, thus the quantum states of NV centers can be optically read out by the intensity of fluorescence. The probe laser 110 may be a green light, having a range of emission between 450 nm to 650 nm. It should be noted while the example of a 532 nm output green laser is provided as an example for the laser probe 110, a different laser probe may be used. In addition, the source of light need not be a laser, but instead a light emitting diode, mercury lamp, filtered white light, or other source of light capable of causing excitement may be used.

The probe laser 110, after passing through a beam splitter 130, is focused at the NV centers by an objective 112. The objective 112 may be any device capable of focusing the emitted laser beam from the probe laser 110, so as to focus the laser beam at the NV centers. An electromagnet 114 is used to apply an external bias DC magnetic field. The external DC magnetic field tunes the resonant frequency of NV centers by tuning the magnetic field as applied to the NV centers such that the resonant frequency of NV centers is tuned, resulting in the NV fluorescence. The external magnetic field also determines which frequencies of electromagnetic field are to be viewed via an imager, demonstrated in the present figure as a CCD array 120. It should be noted, however, that the imager may be a different device, such as, but not limited to, CCD camera or a CMOS camera. Specifically, after calibration, which is detecting the known electromagnetic field signals, the resonant frequency corresponds to the certain voltage/current applied on the electromagnet. Alternatively, the resonant frequency may correspond to a certain distance from a permanent magnet to the NV centers. Tuning can be achieved, for example, by tuning the current of an electromagnet with accuracy better than 100 kHz by a low-cost commercially available electromagnet.

NV fluorescence resulting from NV center emission, as caused by the laser beam and external bias DC magnetic field, is again collected by the objective 112, which focuses the NV fluorescence, transmitting to the CCD array 120. In accordance with the present exemplary embodiment, the CCD array is a cooled EM-CCD array.

In accordance with one exemplary embodiment of the invention, the NV centers are interrogated using luminescent measurement in a wide-field microscope: green light, for example, from a solid-state laser is used to excite NV centers over a wide field of view and red photons emitted from the NVs are imaged using the EM-CCD array 120. Owing to its internal structure, the likelihood of NV—to emit a photon after absorbing one green photon is directly proportional to the spin state of its electron, which in turn is very sensitive to the NVs electromagnetic environment. This allows the intensity and spatial profile of the emitted RF field to be directly imaged on the CCD array 120. The frequency of RF signal that NV responds to, for example, but not limited to, the 10 MHz to 10 GHz range, can be dynamically controlled using the external electromagnet 114. In this way, each NV center plays a role of an atomic-scale RF spectrum analyzer. Using many NVs at the same time, the information about the frequency, intensity and spatial profile of RF field can be easily obtained.

Receipt of the NV center emission by the CCD array 120 results in an optical readout of NVs, where the quantum states of NV centers are read out, thus imaging the IC chip and performing radio-frequency spectrometry at runtime. The optical readout of NVs results in the spectra of electromagnetic fields of the IC chip being tested.

Figure 4:
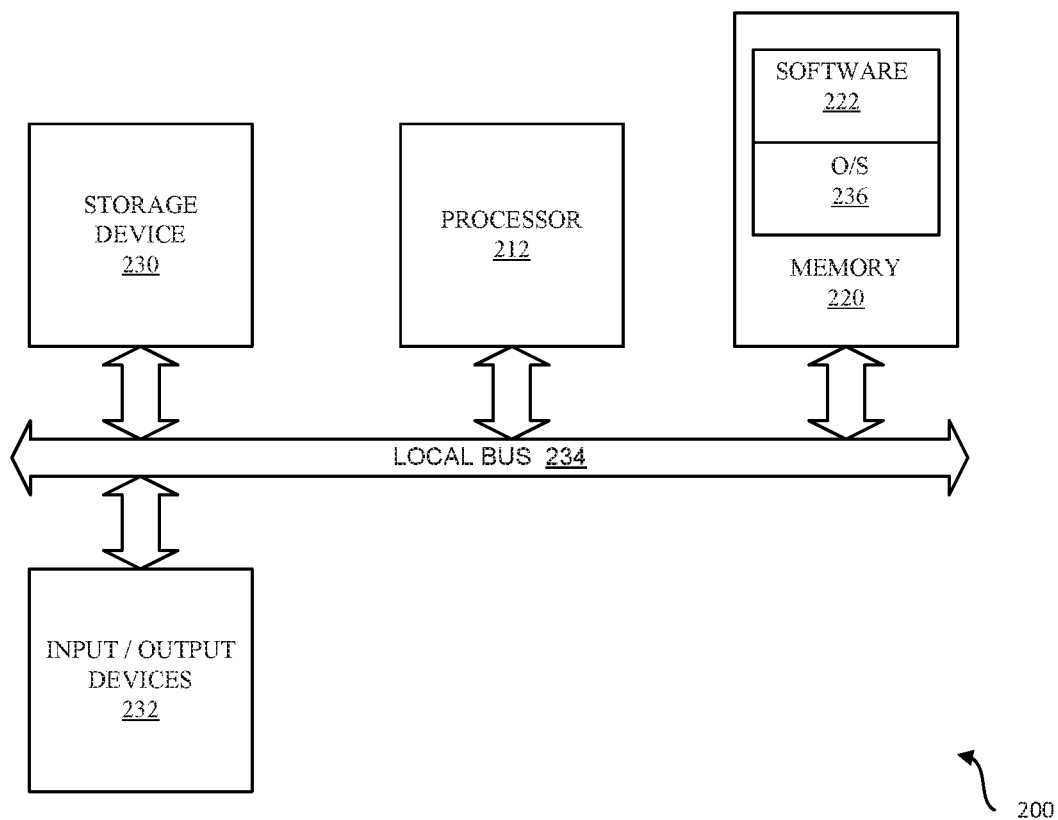
FIG. 4 illustrates a computer connected to the imager, or CCD array of FIG. 3.

The CCD array 120 is preferably connected to a computer 200, as illustrated by FIG. 4, for processing the spectra pf electromagnetic fields of the IC chip being tested. The computer 200 is capable of taking the spectrum of electromagnetic field of the IC chip tested and determining clock frequencies of the IC chip and data bandwidth of the IC chip.

It should be noted that alternatively, or in addition, a spectrum of electromagnetic fields associated with data transmitted by the IC chip may be analyzed for the IC chips by the spectrum of electromagnetic fields associated with the data transmission being received by the CCD array 120.

The computer 200 then compares determined clock frequencies and bandwidth of IC chip to a predefined clock frequency and bandwidth of the IC chip to determine if a foreign device, or software, is located on the tested IC chip. Specifically, an expected range of IC chip clock frequency and data bandwidth is predefined and stored either within a storage device of the computer 200, or at a remote location capable of being accessed by the chip activity imager 100, such as via a local area network, or wirelessly via the internet. The expected range is considered to be the normal functioning range of the IC chip. Determined values outside of these ranges illustrate a foreign presence.

In addition, or in the alternative, data characteristics of the IC chip as displayed by the electromagnetic frequency spectrum associated with the IC chip during transmission of data can be compared to expected data characteristics of the IC chip to determine if a foreign device or software is affecting the tested IC chip.

The present chip activity imager (CHAI) 100 and method operates in two configurations: CHAI-IN and CHAI-OUT. In addition, in each configuration it can run in one of two modes: stimulated and passive. In stimulated mode, custom test programs are loaded onto the processor to stimulate (or inhibit) activity of specific functional units of the processor which enables analysis of the structure of the chip and which functional units are active. The stimulated mode and the data obtained from it can be used to build a model of the processor chip. Model of the chip has two parts: physical structure and operational behavior. In passive mode, the CHAI 100 only measures fluorescence, while the processor chip is running under control of whatever operating system and programs it would usually run. The fluorescence measurements combined with the model of the chip built during the stimulated operation will reveal information about software running on the chip, such as what it is doing by observing which functional units are triggered. Memory access patterns can be observed by analyzing activity in the caches and external memory and I/O by analyzing activity in the memory controller or the uncore components.

The chip activity imager 100 can provide "images" of physical structure of the chip, which is the layout of the processor chip. This information may be obtained from CHAI stimulated mode. By stimulating specific portions of the processor (e.g. arithmetic logic unit, ALU), fluorescence of the chip during stimulated operations will reveal which part of the chip is the ALU. One benefit of the chip activity imager is that it creates images similar to die photos—but not destructively, and ones that dynamically show chip activity. The chip activity imager can also provide operational behavior, which is the analysis of which parts of the chip are active when processing certain instruction streams. Moreover, certain portions of the chip may turn off for power savings or change operational frequency (DVFS). Observing the chip's responses to different instructions is crucial for latter analysis of what is going on when an unknown program is running on the chip.

In accordance with the present invention, the IC chip that is being analyzed does not require any particular treatment, and thus the diamond (which may optionally include an isolation layer) can simply be placed on the surface of the IC chip. Since it is typical for both the IC chip and the diamond slide to be precisely polished, they can make a good contact when placed together. For instance, when analyzing a Flip-Chip Pin Grid Array (FC-PGA) package, in which the bottom of the chip (die) is exposed, the diamond slides used for detection can be easily placed on the exposed side of chip.

According to aspects of the present invention, the present system and method can be integrated into a device that is typically already on hand. Further, solid state laser diodes, MEMS electromagnets, CCD or CMOS chips, and compacted optical components can further make the minimization of the proposed technique possible. For system and method can be easily combined with devices much like a green laser pointer can be combined and used with a cell phone camera.

FIG. 4 further illustrates a general computer 200 that may be used in accordance with the present system and method. Generally, in terms of hardware architecture, as shown in FIG. 3, the computer 200 includes a processor 212, memory 220, storage device 230, and one or more input and/or output (I/O) devices 232 (or peripherals) that are communicatively coupled via a local interface 234. The local interface 234 can be, for example but not limited to, one or more buses or other wired or wireless connections, as is known in the art. The local interface 234 may have additional elements, which are omitted for simplicity, such as controllers, buffers (caches), drivers, repeaters, and receivers, to enable communications. Further, the local interface 234 may include address, control, and/or data connections to enable appropriate communications among the aforementioned components.

The processor 212 is a hardware device for executing software, particularly that stored in the memory 220. The processor 212 can be any custom made or commercially available processor, a central processing unit (CPU), an auxiliary processor among several processors, a semiconductor based microprocessor (in the form of a microchip or chip set), a macroprocessor, or generally any device for executing software instructions.

The memory 220 can include any one or combination of volatile memory elements (e.g., random access memory (RAM, such as DRAM, SRAM, SDRAM, etc.)) and non-volatile memory elements (e.g., ROM, hard drive, tape, CDROM, etc.). Moreover, the memory 220 may incorporate electronic, magnetic, optical, and/or other types of storage media. Note that the memory 220 can have a distributed architecture, where various components are situated remote from one another, but can be accessed by the processor 212.

The software 222 in the memory 220 may include one or more separate programs, each of which contains an ordered listing of executable instructions for implementing logical functions of the computer 200, as previously described. The software 222 in the memory 220 defines the computer 200 functionality in accordance with the present invention. In addition, although not required, it is possible for the memory 220 to contain an operating system (O/S) 236. The operating system 236 essentially controls the execution of computer programs and provides scheduling, input-output control, file and data management, memory management, and communication control and related services.

The computer 200 may be provided by a source program, executable program (object code), script, or any other entity containing a set of instructions to be performed. When a source program, then the program needs to be translated via a compiler, assembler, interpreter, or the like, which may or may not be included within the memory 220, so as to operate properly in connection with the O/S 236. Furthermore, the program can be written as (a) an object oriented programming language, which has classes of data and methods, or (b) a procedure programming language, which has routines, subroutines, and/or functions.

The I/O devices 232 may include input devices, for example but not limited to, a touch screen, a keyboard, mouse, scanner, microphone, or other input device. Furthermore, the I/O devices 232 may also include output devices, for example but not limited to, a display, or other output devices. The I/O devices 232 may further include devices that communicate via both inputs and outputs, for instance but not limited to, a modulator/demodulator (modem; for accessing another device, system, or network), a radio frequency (RF), wireless, or other transceiver, a telephonic interface, a bridge, a router, or other devices that function both as an input and an output.

When the computer 200 is in operation, the processor 212 is configured to execute the software 222 stored within the memory 220, to communicate data to and from the memory 220, and to generally control operations of the computer 200 pursuant to the software 222. The software 222 and the O/S 236, in whole or in part, but typically the latter, are read by the processor 212, perhaps buffered within the processor 212, and then executed.

When functionality of the present system is implemented in software, it should be noted that the functionality can be stored on any computer readable medium for use by or in connection with any computer related system or method. In the context of this document, a computer readable medium is an electronic, magnetic, optical, or other physical device or means that can contain or store a computer program for use by or in connection with a computer related system or method. The functionality can be embodied in any computer-readable medium for use by or in connection with an instruction execution system, apparatus, or device, such as a computer-based system, processor-containing system, or other system that can fetch the instructions from the instruction execution system, apparatus, or device and execute the instructions. In the context of this document, a "computer-readable medium" can be any means that can store, communicate, propagate, or transport the program for use by or in connection with the instruction execution system, apparatus, or device.

The computer readable medium can be, for example but not limited to, an electronic, magnetic, optical, electromagnetic, infrared, or semiconductor system, apparatus, device, or propagation medium. More specific examples (a nonexhaustive list) of the computer-readable medium would include the following: an electrical connection (electronic) having one or more wires, a portable computer diskette (magnetic), a random access memory (RAM) (electronic), a read-only memory (ROM) (electronic), an erasable programmable read-only memory (EPROM, EEPROM, or Flash memory) (electronic), an optical fiber (optical), and a portable compact disc read-only memory (CDROM) (optical). Note that the computer-readable medium could even be paper or another suitable medium upon which the program is printed, as the program can be electronically captured, via for instance optical scanning of the paper or other medium, then compiled, interpreted or otherwise processed in a suitable manner if necessary, and then stored in a computer memory.

The storage device 230 of the computer 200 may be one of many different types of storage device, including a stationary storage device or portable storage device. As an example, the storage device 230 may be a magnetic tape, disk, flash memory, volatile memory, or a different storage device. In addition, the storage device may be a secure digital memory card or any other removable storage device 230. Preferably, the storage device stores predefined IC chip expected clock frequencies and bandwidths.

The following provides an exemplary demonstration of using the present system and method, and it is not intended to limit the present invention. To demonstrate the ability of the present invention and associated method, a micro radio-frequency (RF) coupler as shown in FIG. 5B was fabricated. Two signals were applied to the gold transmission lines of the RF coupler: one at frequency at 2.80 GHz, and the other at 2.78 GHz. Both RF transmission lines generate electromagnetic fields at corresponding frequencies. Since an electromagnetic field at radio frequency 1 ($RF_1$) is generated at the right line, the left region of the area is expected to show a low intensity of electromagnetic field at $RF_1$; the same is expected for radio frequency 2 ($RF_2$).

While the bias magnetic field $B_0$ is scanned from 22 Gauss to 35 Gauss by an electromagnet, the spectra at three typical positions are shown in FIGS. 5D-F. The depth of the dips indicates the intensities of the electromagnetic field at corresponding frequencies. At position A, the intensity of electromagnetic field at $RF_1$ is much weaker than intensity at $RF_2$, while the intensity is almost the same at position B, and much stronger at position C. The reason why a set of three dips is depicted instead of a single dip is due to the superfine structure of the nitrogen atom. Comparing the frequency obtained by fitting the spectra with the frequency of excited RF signals read from the RF generator, the accuracy of frequency is about 0.1 MHz.

By looking at the intensity at $RF_1$ and $RF_2$ at every pixel, the images of intensity of the electromagnetic field are shown in FIGS. 5A and 5C, respectively. The image shows the distribution of electromagnetic field at $RF_1$ and $RF_2$. The imaging result is consistent with the numerical simulations by Microwave Office (A RF simulation software from National Instruments).

Figure 6:
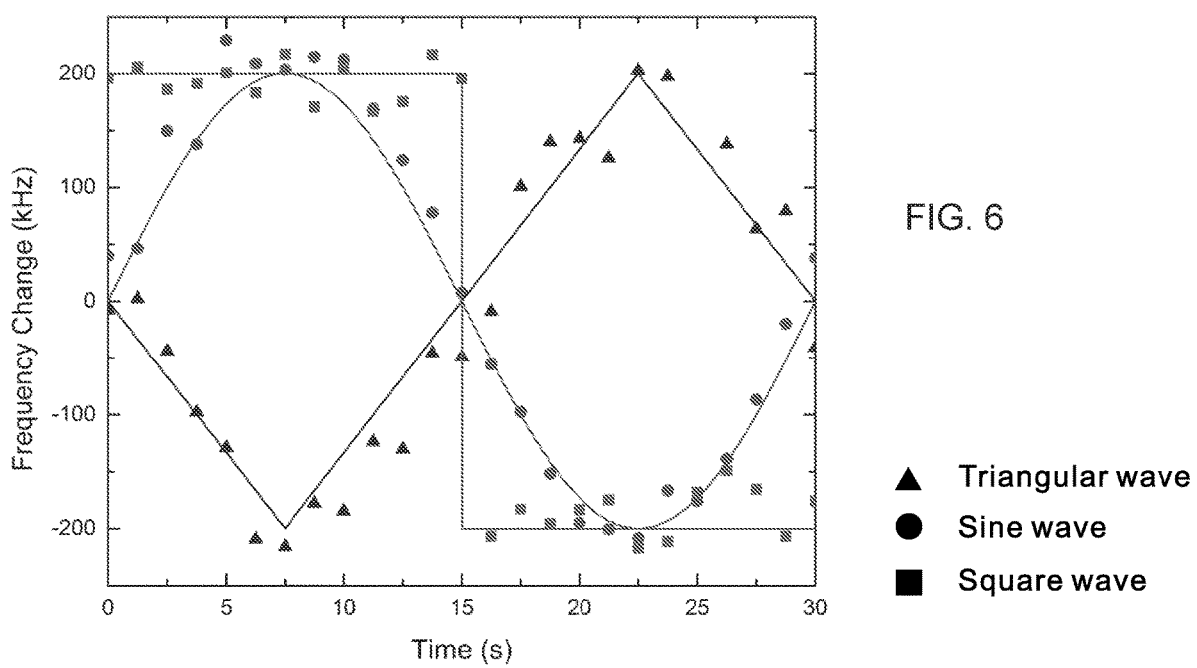
FIG. 6 is a graph illustrating real-time response/ability of the present system and method.

The real time ability of detection using NV centers is demonstrated by monitoring the frequency drift of the object electromagnetic field. A radio-frequency signal with slowing varying frequency (frequency modulation) is delivered to the NV centers using the mentioned transmission line. As shown in the schematic diagram of FIG. 6, frequencies of the radio-frequency signal are modulated by a sine, triangle, or rectangular function, with amplitude of 200 kHz. By monitoring the fluorescence of the NV centers, the frequency drift can be optically read out in real-time. For the security of many systems, the frequency of a signal is crucial for IC, and thus, monitoring the frequency will help in obtaining the activity of IC chip, such as the bandwidth, operation states (e.g. sleep, standby or high performance mode) of the IC.

The present system and method can further be optimized for large area detection, and weak signal detection, optical readout process, and data processing methods. Designed chips with radio-frequency features or Simple IC chips can further be analyzed. The present technique can further be used for the detection of IC chip activity with increasing complexity (e.g., FPGA, or microcontroller board). Beneficially, the dynamic activities of IC chip can be shown, when the chip is configured as various functionalities or various code is running on the chip.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for detecting dynamic electromagnetic emission of an integrated circuit (IC) chip, comprising the steps of:

positioning a diamond slide comprising a plurality of nitrogen vacancy (NV) centers in proximity of an IC chip;

exciting the NV centers via use of light, resulting in an NV fluorescence;

tuning a current applying an external bias direct current (DC) magnetic field for tuning a resonant frequency of the NV centers, thereby influencing the NV fluorescence;

providing an optical readout of the NV fluorescence, wherein the optical readout provides quantum states of the NV centers, thereby providing spectra of electromagnetic fields of the IC chip;

determining at least one of the group comprising clock frequencies of the IC chip, referred to herein as determined clock frequencies, and data bandwidth of the IC chip, referred to herein as determined data bandwidth of the IC chip, from the spectra of electromagnetic fields of the IC chip; and comparing at least one of the group comprising determined clock frequencies and determined data bandwidth, to at least one of the group comprising expected clock frequencies of the IC chip and expected data bandwidth of the IC chip.

2. The method of claim 1, further comprising the step of separating the light used for exciting the NV centers, from the NV fluorescence.

3. The method of claim 1, further comprising the step of focusing the light used for exciting the NV centers to the diamond slide.

4. The method of claim 1, further comprising the step of preventing the light for exciting from damaging the IC chip via use of a light isolation layer.

5. The method of claim 1, further comprising the step of focusing the NV fluorescence prior to the step of providing the optical readout of the NV fluorescence.

6. The method of claim 1, wherein the method is performed in runtime of the IC chip.

7. A method for detecting dynamic electromagnetic emission of an integrated circuit (IC) chip, comprising the steps of:

positioning a diamond slide comprising a plurality of nitrogen vacancy (NV) centers in proximity of an IC chip, the IC chip configured to transmit data;

causing the IC chip to transmit data;

exciting the NV centers via use of light, resulting in an NV fluorescence;

tuning a current applying an external bias direct current (DC) magnetic field for tuning a resonant frequency of the NV centers, thereby influencing the NV fluorescence;

providing an optical readout of the NV fluorescence, wherein the optical readout provides quantum states of the NV centers;

based on the NV fluorescence, determining a spectrum of the electromagnetic fields associated with the data transmitted by the IC chip;

comparing the spectrum of the electromagnetic fields associated with the data transmitted by the IC chip to an expected spectrum; and based on the comparison, determining if a foreign device or software is affecting the IC chip.

* * * * *